United States Patent
Bulur et al.

(10) Patent No.: US 9,557,387 B2
(45) Date of Patent: Jan. 31, 2017

(54) TESTING INDIVIDUAL CELLS WITHIN MULTI-CELL BATTERY APPLICATIONS

(71) Applicant: Lenovo Enterprise Solutions (Singapore) Pte. Ltd., Singapore (SG)

(72) Inventors: Yakup Bulur, Rochester, MN (US); Richard J. Fishbune, Rochester, MN (US); Mark E. Maresh, Cave Creek, AZ (US); Adam M. Wheeler, Rochester, MN (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 108 days.

(21) Appl. No.: 14/618,100

(22) Filed: Feb. 10, 2015

(65) Prior Publication Data
US 2016/0231385 A1 Aug. 11, 2016

(51) Int. Cl.
*G01R 31/36* (2006.01)
*H01M 10/48* (2006.01)

(52) U.S. Cl.
CPC ....... *G01R 31/3606* (2013.01); *G01R 31/3648* (2013.01); *H01M 10/48* (2013.01)

(58) Field of Classification Search
CPC . G01R 31/3606; G01R 31/3648; H01M 10/48
See application file for complete search history.

(56) References Cited

U.S. PATENT DOCUMENTS

| | | | |
|---|---|---|---|
| 3,663,931 A | 5/1972 | Brown | |
| 4,149,764 A | 4/1979 | Mattingly, Jr. | |
| 4,552,422 A | 11/1985 | Bennett et al. | |
| 4,867,691 A | 9/1989 | Eck | |
| 5,367,431 A | 11/1994 | Kunishi et al. | |
| 5,411,400 A | 5/1995 | Subrahmanyan et al. | |
| 5,460,531 A | 10/1995 | Vivio | |
| 5,825,630 A | 10/1998 | Taylor et al. | |
| 5,886,503 A | 3/1999 | McAndrews et al. | |

(Continued)

FOREIGN PATENT DOCUMENTS

| | | |
|---|---|---|
| CA | 2603912 | 10/2006 |
| DE | 19624887 | 1/1997 |

(Continued)

OTHER PUBLICATIONS

Taesic Kim et al., Power electronics-enabled self-x multicell batteries: a design toward smart batteries, Nov. 2012, pp. 4723-4733, ISSN: 0885-8993, Power Electronics, IEEE Transactions on vol. 27 Issue 11, IEEE.

(Continued)

*Primary Examiner* — Stewart Fraser
(74) *Attorney, Agent, or Firm* — Lieberman & Brandsdorfer, LLC (57) ABSTRACT

Embodiments of the invention relate to a multi-cell battery, and individual evaluation of the battery cells. Each cell is individually removed or disconnected from the battery. An adjustable cell charger and an adjustable cell load are mapped to the disconnected cell. As the charger charges the cell, an associated sensor validates acceptance of the charge. As the cell load discharges the cell, the sensor measures discharge characteristics. Operating efficiency of the selected cell is evaluated based on the measured charge acceptance and discharge characteristics.

20 Claims, 5 Drawing Sheets

(56) References Cited

U.S. PATENT DOCUMENTS

| | | |
|---|---|---|
| 5,923,148 A | 7/1999 | Sideris et al. |
| 5,940,263 A | 8/1999 | Jakoubovitch |
| 6,014,013 A | 1/2000 | Suppanz et al. |
| 6,027,828 A | 2/2000 | Hahn |
| 6,146,778 A | 11/2000 | Rouillard et al. |
| 6,268,711 B1 | 7/2001 | Bearfield |
| 6,332,113 B1 | 12/2001 | Bertness |
| 6,773,848 B1 | 8/2004 | Nortoft et al. |
| 7,108,940 B2 | 9/2006 | Sharrow et al. |
| 7,198,866 B2 | 4/2007 | Miyamoto et al. |
| 7,816,055 B2 | 10/2010 | Jacobson et al. |
| 7,960,054 B2 | 6/2011 | Zhang et al. |
| 8,207,740 B2 | 6/2012 | Lin et al. |
| 8,729,904 B2 | 5/2014 | Yount et al. |
| 2002/0175655 A1 | 11/2002 | Huykman et al. |
| 2003/0036311 A1 | 2/2003 | Benson et al. |
| 2006/0108081 A1 | 5/2006 | Onic et al. |
| 2006/0267546 A1 | 11/2006 | Shen et al. |
| 2007/0105409 A1 | 5/2007 | Brekosky et al. |
| 2008/0166926 A1 | 7/2008 | Seymour et al. |
| 2008/0207015 A1 | 8/2008 | Sueyoshi |
| 2009/0284076 A1 | 11/2009 | Lin et al. |
| 2010/0013430 A1 | 1/2010 | Manor et al. |
| 2010/0029103 A1 | 2/2010 | Costello |
| 2010/0134305 A1 | 6/2010 | Lu et al. |
| 2011/0117417 A1 | 5/2011 | Pitts |
| 2011/0140650 A1 | 6/2011 | Zhang et al. |
| 2012/0038315 A1 | 2/2012 | Wong |
| 2012/0242144 A1 | 9/2012 | Chorian et al. |
| 2012/0244390 A1 | 9/2012 | Cheng et al. |
| 2012/0249055 A1 | 10/2012 | Wade |
| 2012/0256592 A1 | 10/2012 | Baughman |
| 2012/0290234 A1 | 11/2012 | Schaefer |
| 2013/0119935 A1 | 5/2013 | Sufrin-Disler et al. |
| 2013/0258830 A1* | 10/2013 | Yoda ............... H02J 7/0068 369/53.42 |
| 2013/0261815 A1 | 10/2013 | Suzuki |
| 2014/0346873 A1* | 11/2014 | Colangelo ............ H02J 1/00 307/29 |
| 2016/0003911 A1* | 1/2016 | Lim ............ G01R 31/3679 324/427 |
| 2016/0231387 A1* | 8/2016 | Hodges ......... G01R 31/3662 |

FOREIGN PATENT DOCUMENTS

| | | |
|---|---|---|
| EP | 507977 | 10/1992 |
| EP | 0588615 | 3/1994 |
| EP | 0932214 | 7/1999 |
| EP | 2375539 | 10/2011 |
| WO | 9526053 | 9/1995 |
| WO | 0019578 | 4/2000 |
| WO | 2007134320 | 11/2007 |
| WO | 2009128079 | 10/2009 |
| WO | 2012149482 | 11/2012 |

OTHER PUBLICATIONS

Goelectricdrive.com, A123 Video Presenting Prismatic Battery Pack, Jun. 14, 2011, 4 pages.

Bonfiglio et al., A Cost Optimized Battery Management System With Active Cell Balancing for Lithium Ion Battery Stacks, Infineon Technologies AG, 2009, pp. 304-309.

Ocean Server Technology, Inc., Large Battery System, 2004, 6 pages.

Ecamion Inc., Lithium Modular Battery Pack, 2009, 9 pages.

* cited by examiner

TESTING INDIVIDUAL CELLS WITHIN MULTI-CELL BATTERY APPLICATIONS

BACKGROUND

This disclosure relates generally to a predictive modeling technique for a multi-cell battery. More specifically, the disclosure relates to testing and analyzing the one or more characteristics of the battery at an individual cell level in a multi-cell architecture.

A battery is a device placed in communication with an electronic machine and functions to supply the machine with electrical energy. The use and evolution of batteries has grown with the use of complex electronic devices. Today, a battery pack with multiple cells is provided to power complex electronic devices. For example, with respect to hybrid and battery operated vehicles, battery packs are known to consist of hundreds or thousands of individual lithium-ion cells within the pack.

Accurate battery pack testing is crucial to indicate the health of a battery pack and predict life performance. When it is indicated that a battery pack is not healthy, the majority of the cells may in fact be healthy, but perhaps one or more unhealthy cells are contributing to the flag indication. This can result in inaccurate cell health estimates and inaccurate prediction of life performance of the battery pack. Accordingly, the health of the battery pack may directly correspond to the health of the individual cells. To remedy this problem, data-based assumptions or algorithmic inferences may be made for each cell's health. These remedies are based on testing the battery pack as a single entity.

SUMMARY

The disclosure includes a method, computer program product, and system for improving cell maintenance in a multi-cell battery.

A method, computer program product, and system are provided for assessing operating characteristics of a cell within the multi-cell battery. Cells within the multi-cell battery are individually selected and placed in an off-line state for assessment. While the selected cell is offline, the battery may continue to operate and provide power through the remaining cells of the battery, through use of a spare cell to support the function of the selected cell, or through an external power source. Operating data associated with the selected cell is acquired through a series of test, including charging the cell and validating acceptance of the charge, and discharging the cell and measuring a discharge characteristic during the discharge. Operating efficiency of the selected cell is evaluated through data acquired from the charge and discharge processes.

These and other features and advantages will become apparent from the following detailed description of the presently preferred embodiment(s), taken in conjunction with the accompanying drawings.

BRIEF DESCRIPTION OF THE DRAWINGS

The drawings referenced herein form a part of the specification. Features shown in the drawings are meant as illustrative of only some embodiments and not of all embodiments, unless otherwise explicitly indicated.

DETAILED DESCRIPTION

It will be readily understood that the components of the present embodiments, as generally described and illustrated in the Figures herein, may be arranged and designed in a wide variety of different configurations. Thus, the following detailed description of the embodiments of the apparatus, system, and method, as presented in the Figures, is not intended to limit the scope, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment. Thus, appearances of the phrases "a select embodiment," "in one embodiment," or "in an embodiment" in various places throughout this specification are not necessarily referring to the same embodiment.

In the Figures and the Detailed Description, like numbers refer to like elements. The drawings are incorporated into, and form part of, the specification. They illustrate embodiments, along with the description serve to explain the principles of the disclosure. The drawings are only illustrative of certain embodiments and do not limit the disclosure. While the embodiments are amenable to various modifications and alternative forms, specifics thereof have been shown by way of example in the drawings and will be described in detail. It should be understood, however, that the intention is not to limit the particular embodiments described. On the contrary, the intention is to cover all modifications, equivalents, and alternatives falling within the spirit and scope of the embodiments.

A multi-cell battery is comprised of two or more connected cells. The cells are arranged in a matrix. Different arrangements of the cells within the matrix are supported. Such arrangements include series, parallel, and a parallel series configuration. In the parallel series configuration, a parallel arrangement includes two or more cells arranged in parallel, and two or more parallel arrangements connected in series.

Figure 1:
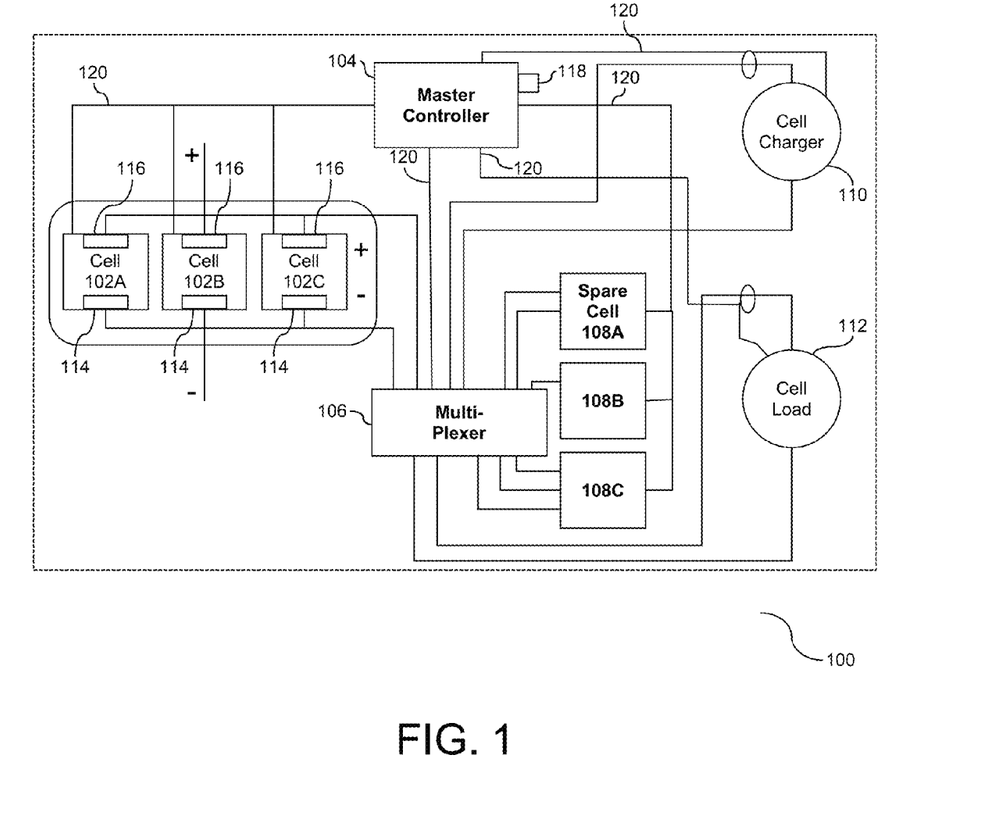
FIG. 1 depicts a block diagram of an example of a battery pack, wherein the cells are configured in parallel and the battery pack includes spare cells.

Referring to FIG. 1, a block diagram (100) of an example multi-cell battery back is provided. As shown, the cells are configured in parallel and the battery pack includes spare cells. In one embodiment, the cells may be configured in series. In another embodiment, the cells may be configured in a series-parallel combination. Similarly, in one embodiment, the battery pack may not include a spare cell. Regardless of the cell alignment and the quantity of spare cells, if any, the components of the battery pack (100) are shown in this example with three cells (102A), (102B), and (102C), temperature sensor (114), a master controller (104), current sensor (116), three spare cells (108A), (108B), and (108C), a cell charger (110), a cell load (112), and a flag (118). All of these components are communicatively coupled, directly or indirectly, for inter-component communication via a common bus (120) between the master controller (104) and the cells (102), multiplexer (106), charger (110), and load (112). The current sensor (116) and the temperature sensor (114) are local to the individual cells (102). The information from each cell charger and cell load is collected over a common bus (120). All controls and communications flow through this bus (120).

As shown, the battery pack (100) is a multi-cell pack showing a plurality of cells (102), which are shown individually as cells (102A), (102B), and (102C). The cells (102) may be of any chemical makeup for use in computers, transportation equipment, or any other application. For example, the cell (102) may be a Lithium ion (Li-ion) cell, a Nickel Cadmium (NiCad) cell, or a Nickel Metal Hydride (NiMH) cell. In other examples, the cell (102) may be a solid-state cell, wherein the solid-state cell is a low-density solid-state cell or a high-energy density solid-state cell. In one embodiment, the solid-state cell may be a solid-state lithium ion cell, wherein the solid-state lithium ion cell utilizes a solid electrolyte, which is in contrast to other examples of lithium ion cells that utilize liquid electrolytes. In one embodiment, the cells (102) may also be of any suitable size or shape. In one embodiment, the cells (102) may include a variety of fully-rated charge capacities and predetermined voltage thresholds. For example, cells (102) may have a voltage threshold of 3.2 volts. In one embodiment, the cells (102) may be housed within an insulation sheath. The insulation sheath may be comprised of any suitable material(s) such as cellulose sheaths (known as fish paper), aramid fiber (known as aramid paper), or polypropylene sheaths. In one embodiment, the cells (102) are configured in parallel, as demonstrated in the battery pack (100), which may attain higher capacity for increased current handling. In one embodiment, the cells (102A), (102B), and (102C) are controlled by the master controller (104), discussed more below, which regulates how the cells (102) are tested according to the present disclosure.

The battery pack (100) may also include at least one temperature sensor (114) for each cell (102). In one embodiment, the temperature sensor (114) may be utilized as a mechanism to measure and predict the health of the cell. More specifically, the temperature sensor (114) measures the temperature of the cell (102) during charging, discharging, and recharging of the cell (102). In one embodiment, the temperature sensor (114) may include two or more pins that are coupled in any suitable manner to the cell (102). For example, two pins may be disposed on the distal ends of the cell (102) such that one pin is coupled directly over the negative terminal and one pin is coupled directly over the positive terminal to measure the temperature of the cell (102). Different measurements reflect the health and longevity of the cell (102) and are related to the health and longevity of the battery pack. For example, a battery at 40 degrees Celsius (104 degrees Fahrenheit), which in one embodiment may be considered a high temperature, may indicate to the master controller (104) that the cell (102) is unhealthy and will have a low battery cycle life. In another example, if the cell (102) operates by charging and discharging at 45 degrees Celsius (113 degrees Fahrenheit), the cycle life may only be half of what can be expected if the cell (102) was 20 degrees Celsius (68 degrees Fahrenheit). In a further example, if the cell (102) operates at a low temperature, such as −20 degrees Celsius (negative four degrees Fahrenheit) then the expected cell life may also be lower. In another example, if the temperature of a particular cell (102) is extremely high, the temperature sensor (114) may communicate with the master controller (104), wherein the master controller (104) may cut off the current to isolate the cell (102) from charging and discharging to avoid overheating.

The battery pack (100) is shown to include a master controller (104). The master controller (104) may include a functional circuit system, such as an integrated circuit, coupled with various components on a circuit board that are operable to provide local control and communication for the battery pack (100). The master controller (104) may protect the battery pack (100) from damage, predict and improve cell (102) longevity, and maintain the battery pack (100) in an accurate and reliable operational condition. In one embodiment, the master controller (104) may inquire via the communication bus (120) to detect current levels from the current sensor (116) of the cell (102). This may be utilized to determine the health of the cell during charging, discharging, and recharging. For example, the current sensor (116) may provide the master controller (104) with a particular current level such that the master controller (104) may perform a coulomb counting function.

In one embodiment, voltage parameters of the battery pack (100) may be sensed via analog signal conditioning circuits within the master controller (104). The outputs of the analog signaling conditioning circuits may be calibrated individually for each cell (102). Similarly, in one embodiment, the temperature of each cell (102) may be obtained by the temperature sensor (114) and sent to the master controller (104) via the analog conditioning circuits. The temperature measurement(s) as ascertained by the sensor (114) may be utilized to help determine the health of each cell during charging, discharging, and recharging. The master controller (104) may also control the charge and discharge procedures. For example, in one embodiment, the master controller (104) may communicate with the cells (102) to monitor, store, and predict cell (102) health based on historical data. For example, the master controller (104) can calculate the state of charge (SoC), state of health (SoH), or remaining useful life (RUL) of the cell (102). In yet another example, the master controller (104) may also monitor charge and discharge rates. In other embodiments, the master controller (104) may provide various safety protections for the battery pack (100). For example, the master controller (104) may provide overvoltage and under voltage protection. Further, the master controller (104) may provide temperature and over current protection. The master controller (104) may also disconnect any of the cells (102) in case of a fault condition, such as transient fault, persistent fault, symmetric fault, arcing fault, or any other fault.

As articulated, the battery pack (100) may be configured with a multiplexer (106). In various embodiments, the multiplexer (106) may be an analog multiplexer, such as a frequency division multiplexer, a wave division multiplexer, a code division multiplexer, or any other multiplexer suitable for battery management systems. The multiplexer (106) may also include digital features, such as digital calibration that may compensate the output voltage loss of the multiplexer (106). The multiplexer (106) may further include two or more inputs, one or more outputs, one or more select inputs (also referred to as control lines), and a switch module. For example the multiplexer (106) may be an 8-to-1 multiplexer, wherein there are eight inputs, one output, and two select inputs. The value of the select inputs may determine the position of a switch module that corresponds to the respective one or more inputs.

The master controller (104) may choose to perform a cell test for a particular cell (102). For example, the master controller (104) may employ an automated algorithm that performs occasional self-checks of the cell (102) to initiate testing. In one embodiment, the algorithm performance is automated. In one embodiment, the master controller (104)

may decide to initiate an individual cell (102) test. Specifically, the master controller (104) communicates with the multiplexer (106) to take a cell offline and further inserts one or more spare cells or obtains supplementary power from an external power source. The master controller (104) may communicate to the switch module of the multiplexer (106) that one of the cells, and in this example cell (102B), needs to be taken offline. The switch module may then open the switch connected to the cell (102B) to take the cell offline. The master controller (104) may also communicate with the multiplexer (106) to insert a spare cell (108) in parallel to the remaining cell(s) (102) or to obtain power from an external source. For example, once the cell (102B) is taken offline, the multiplexer (106) may insert the spare cell (108A), wherein the spare cell (108A) includes a switch module that is closed so that the spare cell (108A) may then effectively be online to support the function of the removed cell (102B). Accordingly, both the multiplexer (106) and the master controller (104) function to support taking at least one cell in a multi-cell battery offline for testing and evaluation, and inserting a spare cell to support the functionality of the removed cell.

Figure 2A:
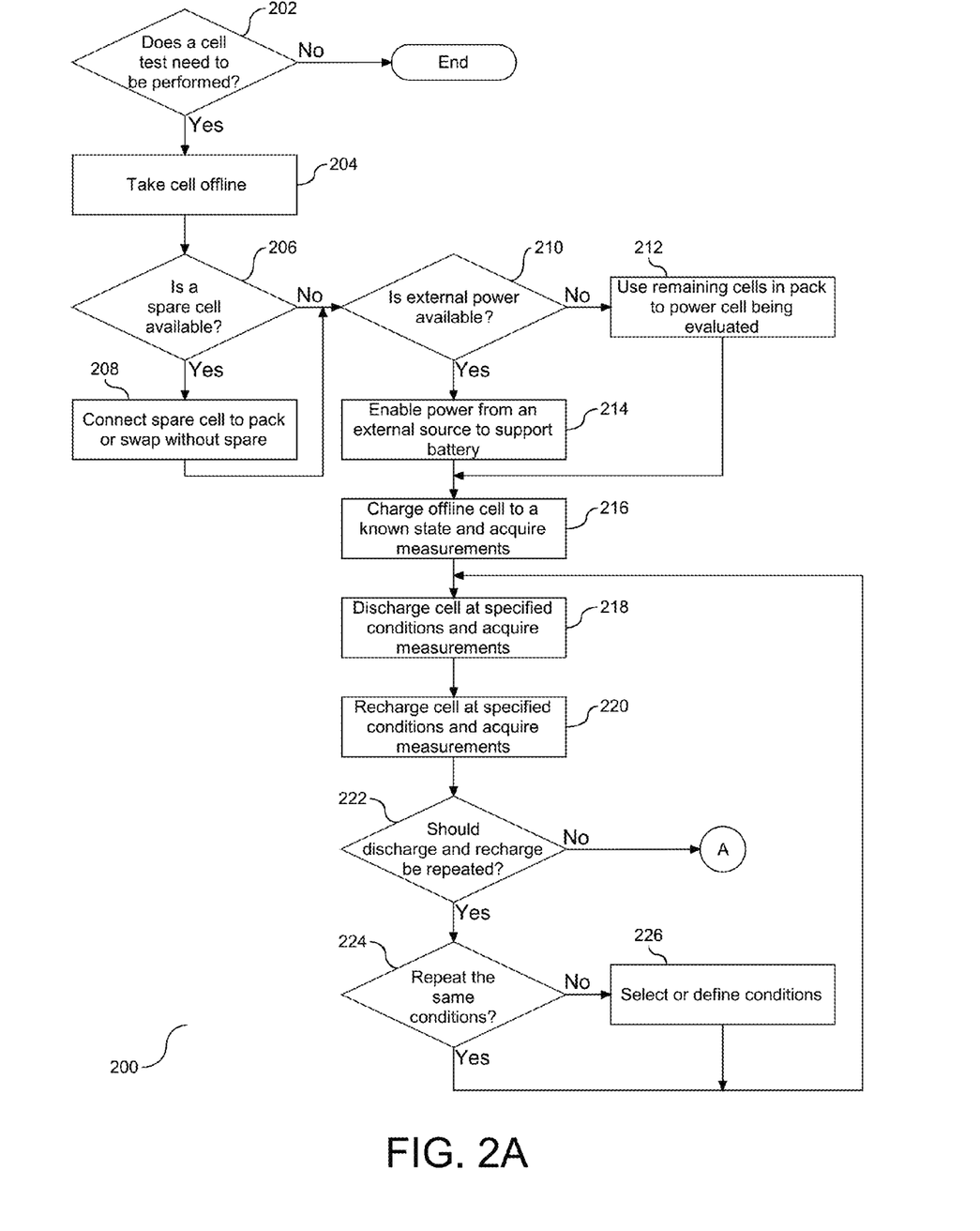
FIGS. 2A and 2B depict a flow chart illustrating a process for testing and evaluating individual cells in a multi-cell battery.
Figure 2B:
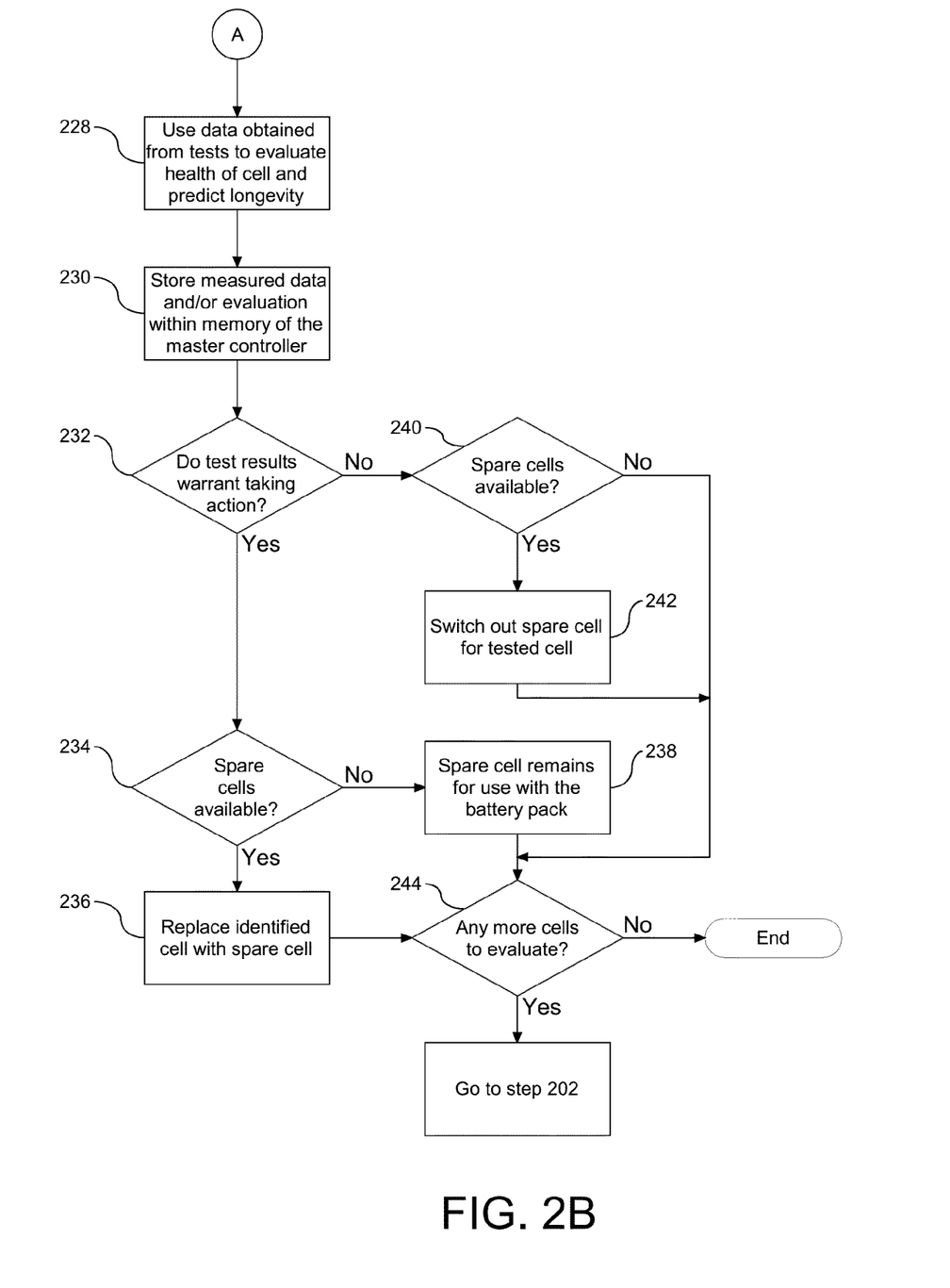

Referring to FIGS. 2A and 2B, a flow chart (200) is provided illustrating a process for testing and evaluating individual cells in a multi-cell battery. As such, it is determined if a cell test has been scheduled or otherwise sought for any one cell(s) in a select multi-cell battery (202). A negative response to the determination at step (202) concludes the evaluation process. However, a positive response to the determination at step (202) is followed by taking one cell within the battery offline (204). In one embodiment, an algorithm is utilized to select which cells are to be evaluated, and the order in which the evaluation takes place. When any cell within the battery is taken offline, the cell may need to temporarily be replaced with power from an alternate source, such as a spare cell. Following step (204), it is determined if there are any spare cells available (206) to function as a replacement for the cell(s) taken offline. A positive response to the determination at step (206) is followed by either connecting the spare cell to the battery pack (208), or in one embodiment swapping out the cell to be evaluated without a replacement spare cell because the multi-cell battery has spare capacity and therefore does not require a replacement cell. Alternatively, if there are no spare cells available at step (206) and the battery prefers additional power to accommodate the removed cell, it is determined if external power is available as a source (210). A negative response to the determination at step (210) is followed by use of the remaining cells in the battery pack to power the cell being evaluated (212). Alternatively, a positive response to the determination at step (210) enables power from an external source to be employed to support the battery (214), and more specifically, to provide required power that may be missing from the cell that has been taken offline.

Once the functionality of the battery is ensured following one of steps (212) or (214), the evaluation of the removed cell may take place. As shown, the removed cell is charged to a known state, or in one embodiment recharged to a known state (216). In either scenario, the charge or recharge is at the cell level and does not include the cells of the battery pack that remain active and online. During the charge or recharge of the cell(s) at step (216), measurements are acquired to validate acceptance of charge. For example, the measurements may include temperature and/or current. Temperature measurement is obtained to address heating or overheating of the cell. Current measurement is obtained to make sure the cell being evaluated is charging properly, i.e. accepting charge. In one embodiment, the starting state of the cell being evaluated, and as such, the measurement takes place when the cell has attained a known state. When the cell has reached a known state, the cell is then discharged at specified conditions so that discharge characteristics may be measured and analyzed (218). More specifically, the cell is discharged at the known state at specified conditions so that the discharge conditions of the cell are defined. Measurements of the discharge characteristics may include coulomb counting to address cell capacity and temperature to measure heat of the cell during the discharge. Accordingly, detailed discharge characteristics of the cell(s) are acquired during discharge of the cell(s) at specified conditions.

Once the discharge of the cell is completed, the cell is recharged, with the recharge taking place under specified conditions (220). More specifically, measurements of the cell take place during the recharge; such measurements may include coulomb counting to address cell capacity during recharge and temperature to measure heat of the cell during the recharge. As shown at steps (218) and (220), the select cell is discharged and recharged, with measurements pertaining to characteristics of the cell acquired under specified conditions. In one embodiment, the first set of discharge and/or recharge cells take place under a first defined set of conditions. In another embodiment, the first discharge takes place under one set of defined conditions, and the first recharge takes place under the same set of conditions as the first charge. Similarly, in one embodiment, the recharge at step (220) takes place under a set of defined conditions which are different from the first defined set of conditions. The recharge is the process in which data such as temperature, capacity (including coulomb count), voltage, and current versus time of charge, is acquired, and in one embodiment may be considered most beneficial in the charge analysis. Following step (220) it is determined if the discharge and recharge of the cell should be repeated (222), and if the discharge and recharge are to be repeated, it is then determined if the conditions will be repeated (224). If at step (224) it is determined to repeat discharge and recharge under the same conditions, then the process returns to step (218) for another set of measurements. However, if at step (224), it is determined to repeat discharge and recharge of the cell under different conditions, then those conditions are either selected or defined (226), and the process then returns to step (218) to acquire data associated with the cell under the new set of conditions. In one embodiment, another set of conditions may include different voltage(s). In one embodiment, another set of conditions may include the same conditions to acquire an additional set of measurements under the same conditions.

Following a negative response to the determination at step (222), the testing of the cell is concluded. Data obtained from the measurements during the discharge and recharge may be evaluated to ascertain the health of the cell, and in one embodiment, to predict the longevity of the cell (228). The measured data and/or evaluation are stored within memory of the master controller (230), see FIG. 1. In one embodiment, the measured data is stored on a cellular basis. In one embodiment, data may be acquired for additional cells in the same battery pack, with the data stored and organized on a cell basis in the master controller. In another embodiment, the acquired data is stored in the master controller with respect to time. Following step (230), it is determined if any of the test result data warrants taking an action, i.e. has any of the acquired data exceeded a threshold (232). In one embodiment, threshold value(s) are pre-set and data that violates the threshold are automatically determined. Threshold data may include a threshold of coulomb count, temperature in excess of a threshold value, and temperature lower than a threshold value.

A cell that has a measurement that is identified at step (232) may require replacement or other corrective action so that it does not affect the integrity of the multi-cell battery as a whole. If at step (232) one or more of the measurements are identified with respect to the cell warranting a corrective action, it is then determined if there are any spare cells available (234). If a spare cell is available, the cell identified for replacement is replaced with the spare cell (236), and in one embodiment, an identifier is set to indicate that the replacement cell is in fact a spare cell. In one embodiment, a spare cell was employed in the battery pack during the testing of one of the cells. If at step (234) it is determined that there are no replacement cells available and the spare cell is already employed in the battery pack, then the spare cell remains for use with the battery pack (238). Similarly, if at step (232) it is determined that the threshold measurement(s) does not warrant a corrective action, it is then determined if there are spare cells available (240). A positive response to the determination at step (240) is followed by switching out the spare cell for the tested cell (242), i.e. swapping back to the original cell. Following any of steps (236), (238), (242), or a negative response to the determination at step (240), concludes the cell evaluation process.

The cell evaluation process shown and described in the flow chart of FIGS. 2A and 2B performs testing and evaluation on the granular level of an individual cell within a battery pack, wherein the battery remains online and functioning during the cell evaluation process. Following the evaluation process of the individual cell, it is determined if any cells in the battery that have not been evaluated (244). If any cells remain to be evaluated, the process returns to step (202) to identify the next cell to be evaluated. Otherwise, the evaluation process concludes. In one embodiment, the order in which the cells within the battery are evaluated is predetermined. Similarly, in one embodiment, the order of the cell evaluation may be arbitrary. Regardless of the order, the cell evaluation enables the health and longevity of the battery to be evaluated on the granular level of the individual cells that comprise the multi-cell battery pack.

The cell evaluation process shown and described in the flow chart of FIGS. 2A and 2B performs a set of tests at the cell level, and in one embodiment, performs repeated testing of the cell(s) under different conditions. The tests performed at the cell level include charging the cell and validating acceptance of charge, discharging the cell and measuring one or more discharge characteristics, and recharging the cell and measuring one or more recharge characteristics of the cell.

Figure 3:
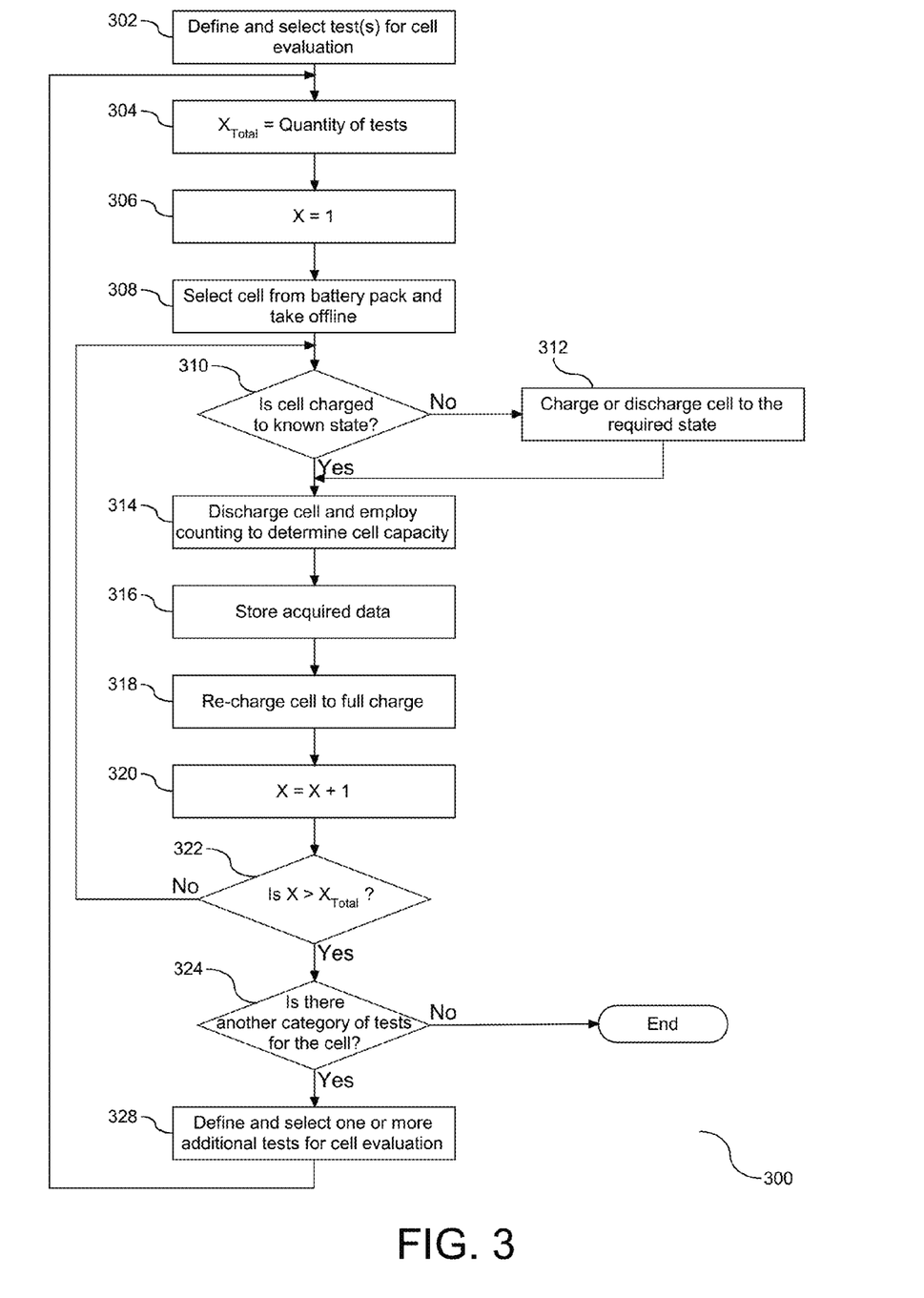
FIG. 3 depicts a flow chart demonstrating a cell evaluation process that supports test repetition.

Referring to FIG. 3, a flow chart (300) is provided demonstrating a cell evaluation process that supports test repetition. It is understood that when products of various forms are tested, there may be outliers. In one embodiment, tests are repeated so that statistical data pertaining to the product may be acquired and outliers identified. Repeating the tests enables an outlier to be disregarded, and for the cell to be evaluated based on statistics in place of a single test result. One or more tests for evaluating one or more battery cells are defined and selected (302). As shown, the quantity of tests to be taken for a single cell may be a preset value, and it is assigned to the variable $X_{Total}$ (304). In one embodiment, the quantity of tests to be conducted may be selected and an associated integer is assigned to the variable $X_{Total}$. Before the cell testing starts, an associated test counting variable, X, is initialized (306). A cell within a multi-cell battery pack is selected for testing and evaluation, and the selected cell is taken offline (308). At the same time, a spare cell or alternate energy source is provided to support the functionality of the battery during the testing and evaluation process. Details associated with the space cell or alternate energy source are shown and described in the flow chart shown in FIGS. 2A and 2B.

Once the cell has been selected and the battery has resumed operation or an operational state, it is determined if the selected cell is charged to a known state (310). In one embodiment, the testing and evaluation starts at a state defined by the quantity of charge in the cell. If the cell does not have the charge state required for testing, then the cell is charged to the required state or discharged to the required state depending on the charge measured in the cell (312). Following a positive response to the determination at step (318) or following step (312), the cell is discharged to a known cut-off voltage and the capacity of the cell is ascertained (314). In one embodiment, capacity is measured by coulomb counting to determine the discharge capacity of the cell at (314). Once the discharge and counting at step (314) is complete, the data acquired with the discharge is stored (316) and the cell is re-charged (318). The recharge at step (318) may be to a full charge, or in one embodiment, to an average charge of the active cells. The test counting variable is incremented (320) and it is determined if all of the tests for the cell have been completed (322). If additional testing remains as demonstrated by a negative response to the determination, then the process returns to step (310). However, if there is no more testing designated for the cell(s), then the testing process concludes.

The testing shown in FIG. 3 is specific to measuring cell capacity. In one embodiment, capacity is measured by coulomb counting and the measurement is stored in memory. In one embodiment, an alternative capacity measurement may be substituted in place of coulomb counting and the alternative capacity measurement is stored in memory. In one embodiment, the measurements acquired during the recharge are stored in the master controller or in memory in communication with the master controller. Following step (322), it is determined if another category of tests is set for the cell (324). A negative response to the determination at step (324) concludes the evaluation of the selected cell. However, a positive response to the determination at step (324) is followed by defining and selecting one or more additional tests for cell evaluation (324), after which the process returns to step (304) to resume evaluation of the cell directed to the additional test(s). Accordingly, as shown one or more tests may be invoked to measure cell characteristics, and one or more of these tests may be repeated to acquire additional data for the cell.

Based upon the plurality of test data acquired and stored per cell, statistical evaluation(s) may be performed on a cell basis. Such statistical data may include acquisition of a mean or average, mode, removal of outlier, etc. In one embodiment, one or more aspects of the test data may be an inaccurate representation of the cell. Through multiple cell assessments, a single misreading of a measurement may be identified so as not to be the sole value associated with the cell.

Figure 4:
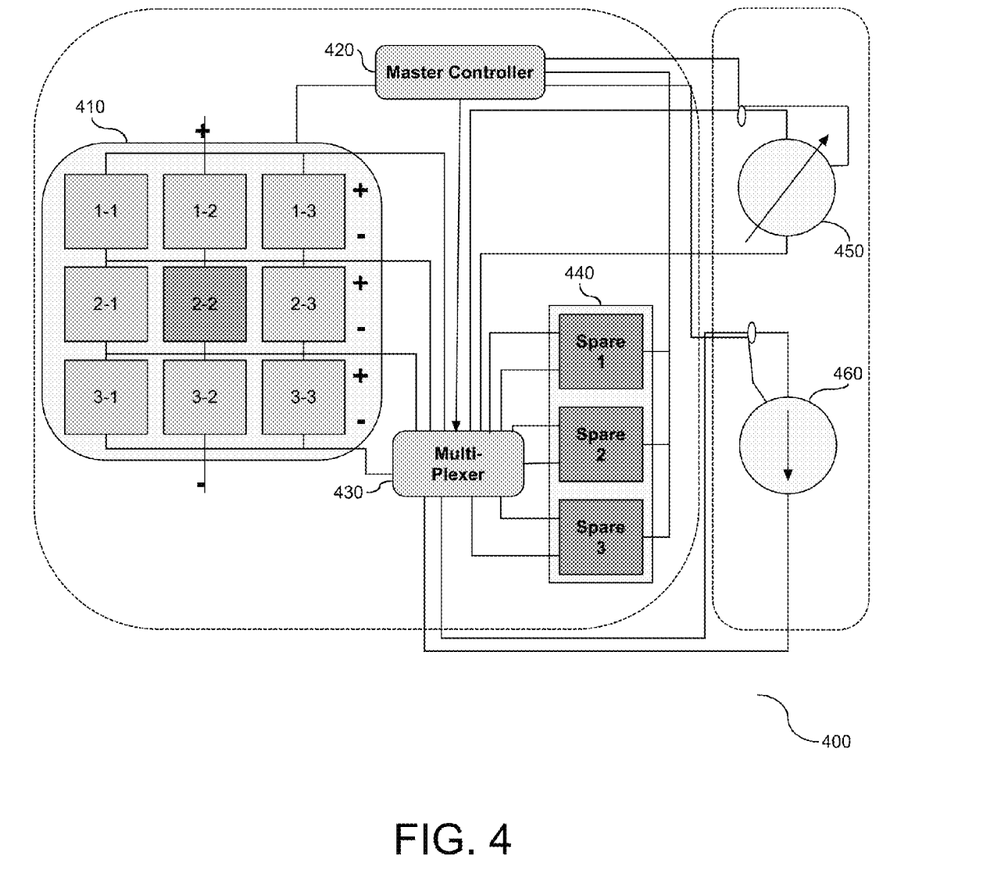
FIG. 4 depicts a block diagram illustrating hardware components employed to support the battery cell testing.

Referring to FIG. 4, a block diagram (400) is provided illustrating hardware components employed to support the battery cell testing. As shown, a matrix of cells (410) in the multi-cell battery is provided. The cells may include different arrangements, including series, parallel, or a combination of series-parallel. The matrix (410) is in communication with a master controller (420) and a multiplexer (430).

Details of the master controller (420) and multiplexer (430) are shown and described in FIG. 1. A set of spare cells are shown (440), and in this example includes three spare cells, although this quantity should not be considered limiting. At such time one of the cells in the matrix (410) is selected for testing. The master controller (420) electrically removes the selected cell from the battery pack matrix, and communicates with the multiplexer (430) to insert a spare cell from the set of spare cells (440). In one embodiment, the matrix is a parallel arrangement of battery cells, and as such the multiplexer (430) inserts the spare cell in parallel to the matrix (410).

Two additional elements are shown in the block diagram, including an adjustable cell charger (450) and an adjustable cell load (460). Once the cell to be tested is offline, e.g. electrically disconnected from the matrix (410), the adjustable cell charger (450) is mapped to the removed cell, and can charge the cell being evaluated. More specifically, the adjustable cell charger (450) is employed to charge the cell subject to evaluation. Similarly, the adjustable cell load (460) is employed to discharge the cell being evaluated so that data associated with the cell during discharge may be obtained. Accordingly, the adjustable cell charger (450) and the adjustable cell load (460) function to support cell evaluation, and specifically to adjust the charge level of the cell depending on the requirements of the testing being conducted.

The hardware components and associated methods support and enable testing multi-cell batteries at the cell level, while enabling the battery to remain online and in use. As described above, a spare cell or external power source may replace the cell that is taken offline for testing, thereby not reducing the capacity of the battery. In one embodiment, the battery is configured with extra cell capacity, so that removal of an individual cell does not require power from a spare cell or an external power source. Similarly, in one embodiment, the battery may not require a full charge to be considered operable during cell testing. The adjustable cell charger (450) may provide charge to the cell, if necessary. In one embodiment, a fixed cut-off voltage is associated with individual cells in the pack. The adjustable load cell (460) regulates the discharge current and checks that the cut-off voltage of the test has not been reached. The discharge current and cut-off voltage are parameters that the master controller communicates to the adjustable load cell. Since the parameters are passed to the adjustable cell load (460), the embodiment employs a method to allow for a variable cut-off voltage and a variable discharge current.

As shown in FIG. 4, the cells of the multi-cell battery are arranged in a matrix. Based on this physical arrangement, for each cell being tested, the amount of current that the cell under evaluation is known. This reduces risk of degradation of the cell.

In FIG. 4, the adjustable cell charger (450) is shown and described. The charger (450) provides full control over recharge parameters of the individual cell(s) being evaluated. Such parameters include, but are not limited to, voltage and current. At the same time, this control reduces risks associated with cell degradation.

As shown and described above, cells are individually and independently taken offline for evaluation. A spare cell, if available, may be employed to provide the power lost from the cell taken offline. In one embodiment, a spare cell or external power may not be available, and the battery may have enough power to maintain operation(s) from the cells in the matrix remaining online and active. More specifically, the battery may continue to operate from the rest of the battery pack to power an associated circuit during testing of the individual cell(s).

Cell evaluation is on the granular level of the individual cells. The cells may be individually charged to get to a known state. This allows the test to be performed on a battery pack that is not fully charged. Furthermore, data is acquired in each cell, and as such in one embodiment, health and longevity of the cell may be predicted. In one embodiment, the health and longevity of the multi-cell battery pack may be predicted through modeling techniques from the cell data.

The cell evaluations shown and described herein employ the adjustable cell charger (450) to provide charge to the individual cell being evaluated. In one embodiment, charge parameters of the cell may be changed to acquire different data. For example, a cell manufacturer may give data at 4.2 volt charge, but the battery pack may only be charging to 4.1 volts. The individual cells may be tested at 4.2 volts, which would provide data as a comparison to the manufacturer test data. In one embodiment, the current may be modified. Similarly, in one embodiment, alternative parameters associated with operating characteristics of the cell may be modified with the cell characteristics evaluated with the modified parameter(s).

The adjustable load cell (460), also referred to herein as discharge block (460), functions to address cell evaluation associated with discharging the cell so that discharge characteristics may be measured and analyzed. More specifically, the discharge block is a variable which can be modified to evaluate the cell state of health at various discharge currents to a cut-off voltage. Detail of the implementation of the discharge block are shown and described in detail in the flow chart of FIGS. 2A and 2B. As an example of implementation, a cell is selected for evaluation, and the cell is discharged at 2 amperes via the discharge block (460). However, the cell manufacturer rates the cell at 1 ampere and 5 amperes discharge current. The discharge evaluation supports testing the cell at either or both of these discharge rates to obtain a clear understanding of the cell state of health.

As shown in FIGS. 1-4, one or more cell characteristics are measured, including current, voltage, and temperature, for individual cells within a multi-cell battery. The embodiments disclosed herein may be a system, method, and/or a computer program product. The computer program product may include a computer readable storage medium (or media) having computer readable program instructions thereon for causing a processor to carry out aspects of the embodiments.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present embodiments may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present embodiments.

Aspects of the present embodiments are described herein with reference to flowchart illustrations and/or block diagrams of methods, apparatus (systems), and computer program products according to the embodiments. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowcharts and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the functions/acts specified in the flowcharts and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowcharts and/or block diagram block or blocks.

The flowcharts and block diagrams in the Figures illustrate the architecture, functionality, and operation of possible implementations of systems, methods, and computer program products according to various embodiments. In this regard, each block in the flowcharts or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions, or acts or carry out combinations of special purpose hardware and computer instructions.

The terminology used herein is for the purpose of describing particular embodiments only, and is not intended to be limiting. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step-plus-function elements in the claims below are intended to include any structure, material, or act for performing the function in combination with other claimed elements as specifically claimed. The description of the present embodiments has been presented for purposes of illustration and description, but is not intended to be exhaustive or limited to the form disclosed. Many modifications and variations will be apparent to those of ordinary skill in the art without departing from the scope and spirit. The embodiment(s) was chosen and described in order to best explain the principles and the practical application, and to enable others of ordinary skill in the art to understand the various embodiments with various modifications as are suited to the particular use contemplated. For each cell in the matrix, tests are conducted to ascertain operating characteristics of the cell, which may affect operating characteristics of the battery, such as longevity. As demonstrated, the battery may continue to operate via a spare cell, an external power source, or the remaining cells in the matrix, without shutting down the battery pack in its entirety. Accordingly, the implementation allows measurement and evaluation of individual cells within a multi-cell battery pack to ascertain and monitor the state of health of each cell in the battery pack, including, but not limited to temperature, voltage, and current sensing.

It will be appreciated that, although specific embodiments have been described herein for purposes of illustration, various modifications may be made without departing from the spirit and scope. Accordingly, the scope of protection of this invention is limited only by the following claims and their equivalents.

What is claimed is:

1. A method comprising:
    selecting a first cell from a plurality of interconnected cells constituting a multi-cell battery;
    selecting a spare cell supporting the functionality of the selected first cell;
    performing a cell swap, while the multi-cell battery remains in an operating state including:
        placing the selected first cell in an offline state;
        placing the spare cell in an online state; and
    performing an evaluation of the selected first cell.

2. The method of claim 1, wherein performing an evaluation of the selected first cell comprises:
    charging the selected first cell to a predetermined cell level and validating acceptance of a charge;
    utilizing a discharge parameter, discharging the selected first cell and measuring a discharge characteristic during discharge;
    determining operating efficiency of the selected first cell with the validated charge acceptance and the discharge characteristic; and
    recharging the first cell utilizing a known recharge parameter and measuring a recharge characteristic of the first cell.

3. The method of claim 2, further comprising storing the measured recharge and discharge characteristics with a controller in communication with the battery.

4. The method of claim 2, wherein the determining operating efficiency of the selected first cell includes measuring temperature of the first cell in the offline state during the discharging and recharging.

5. The method of claim 2, further comprising obtaining capacity of the selected first cell in the offline state during the discharging and recharging of the first cell.

6. The method of claim 2, wherein recharging utilizes a parameter selected from the group consisting of: voltage and current, at a different level than the charging.

7. The method of claim 1, wherein performing an evaluation of the selected cell utilizes power from at least one unselected cell from the plurality of interconnected cells constituting the multi-cell battery.

8. A computer program product comprising a computer readable storage medium having program instructions embodied therewith, the program instructions executable by a controller in communication with a multi-cell battery, the instructions to perform a method comprising:
    in the multi-cell battery having a plurality of interconnected cells, individually selecting one of the cells, placing the selected cell in an offline state and placing a spare cell supporting the functionality of the first cell in an online state while the battery remains in an operating state; and
    performing an evaluation of the selected cell.

9. The computer program product of claim 8, wherein performing an evaluation of the selected cell comprises:
    charging the selected cell to a predetermined cell level and validating acceptance of a charge;
    discharging the selected cell utilizing a known recharge parameter and measuring a discharge characteristic during the discharging;
    determining operating efficiency of the selected cell with the validated charge acceptance and the measured discharge characteristic; and
    recharging the cell utilizing a known recharge parameter and measuring a recharge characteristic of the cell.

10. The computer program product of claim 9, further comprising storing the measured recharge and discharge characteristics with the controller.

11. The computer program product of claim 9, wherein determining operating efficiency of the selected cell includes measuring temperature of the cell in the offline state during the discharging and recharging.

12. The computer program product of claim 9, further comprising obtaining capacity of the selected cell in the offline state during the discharging and recharging of the cell.

13. The computer program product of claim 9, wherein recharging utilizes a parameter selected from the group consisting of: voltage and current, at a different level than the charging.

14. A system comprising:
    a battery pack arrangement with multiple cells, the cells arranged in a matrix and electrically connected;
    a controller in communication with the cells, the controller to select one of the cells in the arrangement, a multiplexer to place the selected cell in an offline state, and place a spare cell supporting the functionality of the first cell in an operating state while the battery pack remains in an operating state; and
    the controller to perform an evaluation of the selected cell.

15. The system of claim 14, wherein the controller to perform an evaluation of the selected cell comprises:
    a cell charger to charge the selected cell to a predetermined cell level and a sensor to validate acceptance of the charge;
    a cell load to discharge the cell utilizing a discharge parameter and the sensor to measure a discharge characteristic during the discharge;
    the controller to determine operating efficiency of the selected cell with the validated charge acceptance and the measured discharge characteristic; and
    recharge the cell utilizing a recharge parameter and measure a recharge characteristic of the cell.

16. The system of claim 15, further comprising the controller to store the measured recharge and discharge characteristics.

17. The system of claim 15, wherein the controller determination of operating efficiency of the selected cell further comprising, a temperature sensor in communication with the controller, the sensor to measure temperature of the cell in the offline state during cell discharge and recharge.

18. The system of claim 15, further comprising the cell charger to obtain capacity of the selected cell in the offline state during the discharge and recharge of the cell.

19. The system of claim 15, wherein the cell load recharges the selected cell utilizing a parameter selected from the group consisting of: voltage and current, at a different level than during a charge.

20. The system of claim 14, wherein the sensor to validate acceptance of the charge and to measure a discharge characteristic during the discharge is a current sensor.

* * * * *